(12) United States Patent
Lee et al.

(10) Patent No.: US 8,785,969 B2
(45) Date of Patent: Jul. 22, 2014

(54) RESURF STRUCTURE AND LDMOS DEVICE

(75) Inventors: Chung-Yeh Lee, Hsinchu (TW);
Pei-Hsun Wu, Hsinchu (TW);
Shiang-Wen Huang, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 299 days.

(21) Appl. No.: 13/169,052

(22) Filed: Jun. 27, 2011

(65) Prior Publication Data

US 2012/0280317 A1     Nov. 8, 2012

(30) Foreign Application Priority Data

May 6, 2011    (TW) ............................... 100115939 A

(51) Int. Cl.
*H01L 29/78* (2006.01)

(52) U.S. Cl.
CPC ......... *H01L 29/7817* (2013.01); *H01L 29/7826* (2013.01)
USPC ............ 257/141; 257/E29.261; 257/E21.452; 257/E29.031; 257/343; 257/E29.187

(58) Field of Classification Search
None
See application file for complete search history.

(56) References Cited

U.S. PATENT DOCUMENTS

| 6,794,755 B2 * | 9/2004 | Maiz et al. ..................... 257/758 |
| 2002/0195627 A1 * | 12/2002 | Kinzer et al. ................. 257/288 |
| 2008/0090347 A1 * | 4/2008 | Huang et al. .................. 438/197 |

* cited by examiner

*Primary Examiner* — Julio J Maldonado
*Assistant Examiner* — Mohammad Choudhry
(74) *Attorney, Agent, or Firm* — Jinaq Chyun IP Office

(57) ABSTRACT

A reduced surface field (RESURF) structure and a lateral diffused metal oxide semiconductor (LDMOS) device including the same are provided. The RESURF structure includes a substrate of a first conductivity type, a deep well region of a second conductivity type, an isolation structure, at least one trench insulating structure, and at least one doped region of the first conductivity type. The deep well region is disposed in the substrate. The isolation structure is disposed on the substrate. The trench insulating structure is disposed in the deep well region below the isolation structure. The doped region is disposed in the deep well region and surrounds a sidewall and a bottom of the trench insulating structure.

16 Claims, 3 Drawing Sheets

RESURF STRUCTURE AND LDMOS DEVICE

CROSS-REFERENCE TO RELATED APPLICATION

This application claims the priority benefit of Taiwan application serial no. 100115939, filed May 6, 2011. The entirety of the above-mentioned patent application is hereby incorporated by reference herein and made a part of this specification.

BACKGROUND OF THE INVENTION

1. Field of Invention

The present invention is related to a semiconductor device, and in particular to a reduced surface field (RESURF) structure and a lateral diffused metal oxide semiconductor (LDMOS) device including the structure.

2. Description of Related Art

In recent years, LDMOS devices have been widely used in all types of power integrated circuits or smart power integrated circuits. Operation of an LDMOS device requires a high breakdown voltage and a low on-state resistance (Ron), so that performance of the device is enhanced. In order to obtain a high breakdown voltage and a low on-state resistance, a type of so-called RESURF LDMOS device is accordingly developed. The main operation principle is that a P-type doped region is implanted in an N-type drifting region below a field oxide layer. When a reverse bias voltage is applied to the N-type region and P-type region in the device area, charges in the N-type and P-type regions need to be balanced to achieve a high breakdown voltage. Since the P-type doped region is added, the concentration in the N-type doped drifting region must be increased, and thus the on-state resistance is reduced.

Generally, the doped region which is used for reducing a surface field in the LDMOS device is formed by a single implantation method to form a layer under the field oxide layer. The doped region is limited by the implantation energy and can only be formed at the surface, so that only 1-dimensional charge balancing can be achieved, and device performance is only enhanced to a limited extent.

SUMMARY OF THE INVENTION

In light of the above, the present invention provides a RESURF structure and an LDMOS device including the structure, so that the position of the P-type doped region is deeper, and 2-dimensional charge balancing is further achieved. Moreover, the concentration in an N-type drifting region is also increased, thereby enhancing device performance.

The present invention provides an LDMOS device which includes a substrate of a first conductivity type, an epitaxial layer of a second conductivity type, a well region of the first conductivity type, a deep well region of the second conductivity type, a source region of the second conductivity type, a drain region of the second conductivity type, an isolation structure, a gate, at least one trench insulating structure and at least one doped region of the first conductivity type. The epitaxial layer is disposed on the substrate. The well region is disposed in the epitaxial layer. The deep well region is disposed in the epitaxial layer. The source region is disposed in the well region. The drain region is disposed in the deep well region. The isolation structure is disposed on the deep well region. The gate is disposed on the epitaxial layer between the drain region and the source region and extends to above a portion of the isolation structure. The trench insulating structure is disposed in the deep well region below the isolation structure. The doped region is disposed in the deep well region and surrounds a sidewall and a bottom of the trench insulating structure.

According to an embodiment of the present invention, the LDMOS device further includes a buried layer of the second conductivity type disposed in the substrate below the deep well region.

According to an embodiment of the present invention, the doped region is physically connected to the isolation structure and the buried layer.

According to an embodiment of the present invention, the doped region is physically connected to the isolation structure but is not physically connected to the buried layer.

According to an embodiment of the present invention, the doped region is physically connected to the isolation structure and the substrate.

According to an embodiment of the present invention, the doped region is physically connected to the isolation structure but is not physically connected to the substrate.

According to an embodiment of the present invention, a material of the trench insulating structure includes silicon oxide.

According to an embodiment of the present invention, the isolation structure includes a field oxide structure or a shallow trench isolation structure.

According to an embodiment of the present invention, the LDMOS device further includes a body region of the first conductivity type disposed in the well region.

According to an embodiment of the present invention, the LDMOS device further includes a gate oxide layer disposed between the gate and the epitaxial layer.

According to an embodiment of the present invention, the first conductivity type is P-type, and the second conductivity type is N-type; or the first conductivity type is N-type, and the second conductivity type is P-type.

The present invention further provides a RESURF structure which includes a substrate of the first conductivity type, a deep well region of the second conductivity type, an isolation structure, at least one trench insulation structure, and at least one doped region of the first conductivity type. The deep well region is disposed in the substrate. The isolation structure is disposed on the substrate. The trench insulating structure is disposed in the deep well region below the isolation structure. The doped region is disposed in the deep well region and surrounds a sidewall and a bottom of the trench insulating structure.

According to an embodiment of the present invention, the RESURF structure further includes a buried layer of the second conductivity type disposed in the substrate below the deep well region.

According to an embodiment of the present invention, the doped region is physically connected to the isolation structure and the buried layer.

According to an embodiment of the present invention, the doped region is physically connected to the isolation structure but is not physically connected to the buried layer.

According to an embodiment of the present invention, the doped region is physically connected to the isolation structure and the substrate.

According to an embodiment of the present invention, the doped region is physically connected to the isolation structure but is not physically connected to the substrate.

According to an embodiment of the present invention, a material of the trench insulating structure includes silicon oxide.

According to an embodiment of the present invention, the isolation structure includes a field oxide structure or a shallow trench isolation structure.

According to an embodiment of the present invention, the first conductivity type is P-type, and the second conductivity type is N-type; or the first conductivity type is N-type, and the second conductivity type is P-type.

In summary, in the structure according to the present invention, at least one trench insulating structure and at least one doped region are disposed in the substrate, and the doped region surrounds the sidewall and the bottom of the trench insulating structure, so as to reduce the surface field. According to the present invention, the trench is first formed and a tilted ion implantation process is then performed, so that the position of the P-type doped region is deeper, and 2-dimensional charge balancing is further achieved. Moreover, the concentration in the N-type drifting region is also increased, thereby enhancing device performance.

In order to make the aforementioned and other objects, features and advantages of the present invention comprehensible, embodiments accompanied with figures are described in detail below.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
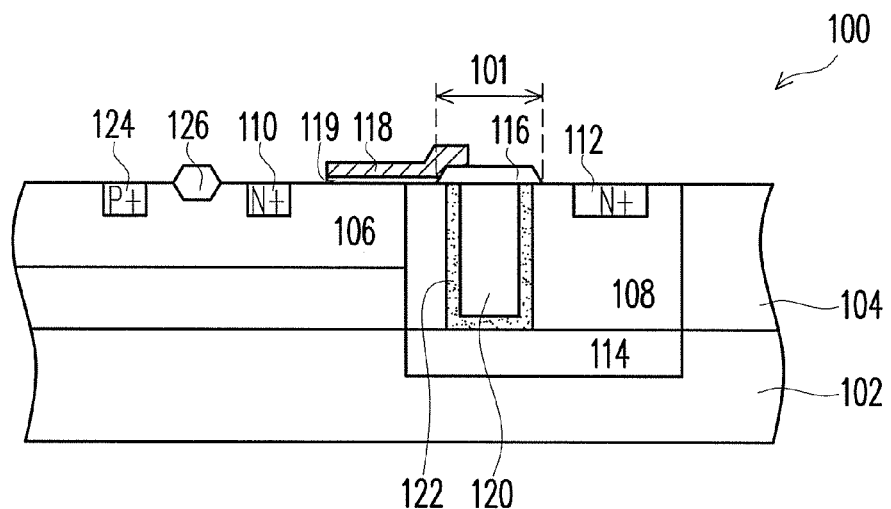
FIG. 1 is a schematic cross-sectional diagram of an LDMOS device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1A:
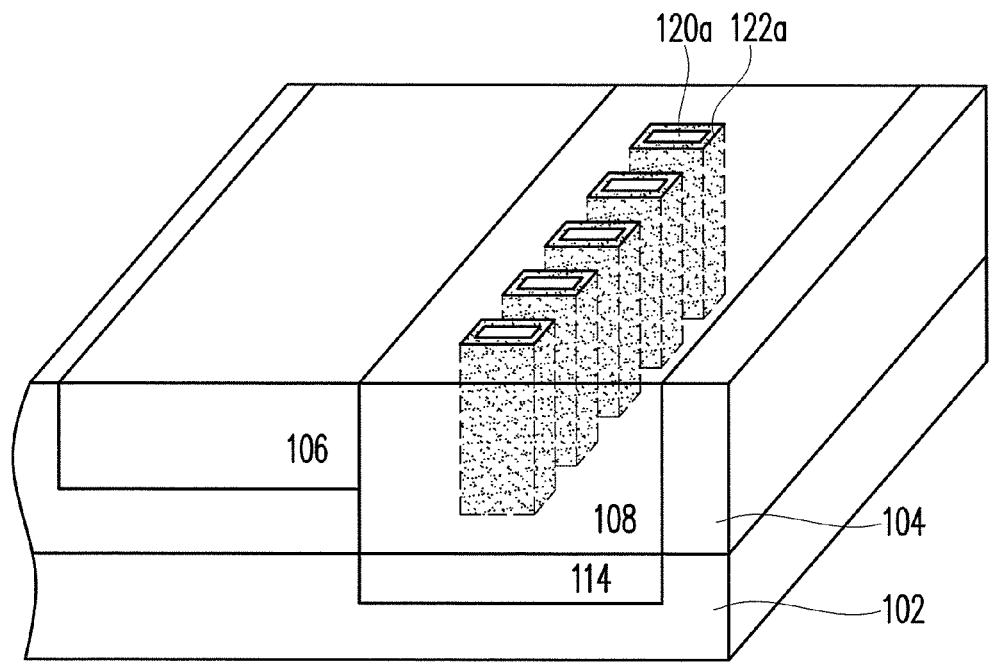
FIG. 1A is a partial schematic perspective diagram of FIG. 1.

FIG. 1 is a schematic cross-sectional diagram of an LDMOS device according to an embodiment of the present invention. FIG. 1A is a partial schematic perspective diagram of FIG. 1. For clarity of description, elements such as an isolation structure 116, a gate 118, a gate oxide layer 119, a source region 110, and a drain region 112 are not shown in FIG. 1A.

Please refer to FIG. 1, an LDMOS device 100 according to the present invention includes a substrate 102 of a first conductivity type, an epitaxial layer 104 of a second conductivity type, a well region 106 of the first conductivity type, a deep well region 108 of the second conductivity type, a source region 110 of the second conductivity type, a drain region 112 of the second conductivity type, a buried layer 114 of the second conductivity type, an isolation structure 116, a gate 118, and a gate oxide layer 119.

The first conductivity type may be P-type or N-type. When the first conductivity type is P-type, the second conductivity type is N-type. When the first conductivity type is N-type, the second conductivity type is P-type. The present embodiment is described as the first conductivity type being P-type and the second conductivity type being N-type.

The substrate 102 is, for example, a P-type silicon substrate. The epitaxial layer 104 is, for example, an N-type epitaxial layer which is disposed on the substrate 102. The substrate 102 and the epitaxial layer 104 may also be viewed as a composite substrate.

The well region 106 is, for example, a P-type well region which is disposed in the epitaxial layer 104. The deep well region 108 is, for example, an N-type well region which is disposed in the epitaxial layer 104. According to the present embodiment, the well region 106 and the deep well region 108 are physically connected, as shown in FIG. 1. According to an embodiment (not shown), the well region 106 and the deep well region 108 may also be separated.

The source region 110 is, for example, an N-type heavily doped region which is disposed in the well region 106. The drain region 112 is, for example, an N-type heavily doped region which is disposed in the deep well region 108. The buried layer 114 is, for example, an N-type lightly doped layer which is disposed in the substrate 102 below the deep well region 108.

The isolation structure 116 is disposed on the deep well region 108. The isolation structure 116 is, for example, a field oxide (FOX) structure or a shallow trench isolation (STI) structure. The method of forming the isolation structure 116 includes performing a chemical vapor deposition (CVD) process or a thermal oxidation process. In an embodiment, the isolation structure 116 is disposed on the deep well region 108 and connected to the trench isolation structure 120 and the doped region 122, as shown in FIG. 1. However, the present invention is not limited thereto. In another embodiment (not shown), the isolation structure 116 is disposed on the deep well region 108 and only connected to the doped region 122. The gate 118 is disposed on the epitaxial layer 104 between the drain region 112 and the source region 110 and extends to above a portion of the isolation structure 116. A material of the gate 118 is, for example, polysilicon. The gate oxide layer 119 is disposed between the gate 118 and the epitaxial layer 104. A material of the gate oxide layer 119 is, for example, silicon oxide.

According to an embodiment, the LDMOS device 100 of the present invention further includes a body region 124 and an isolation structure 126. The body region 124 is, for example, a P-type heavily doped region which is disposed in the well region 106. The source region 110 and the body region 124 are, for example, separated by the isolation structure 126. The isolation structure 126 is, for example, a FOX structure or an STI structure.

It should be particularly noted that the LDMOS device 100 according to the present invention further includes at least one trench insulating structure 120 and at least one doped region 122 of the first conductivity type, so as to reduce a surface field.

The trench insulating structure 120 is disposed in the deep well region 108 below the isolation structure 116. A material of the trench insulating structure 120 is, for example, silicon oxide. The doped region 122 is, for example, a P-type lightly doped region which is disposed in the deep well region 108 and surrounds a sidewall and a bottom of the trench insulating structure 120.

According to an embodiment, the trench insulation structure 120 includes a plurality of separate trench insulation structures 120a, and the doped region 122 includes a plurality of separated doped regions 122a, as shown in FIG. 1A. The doped regions 122a are disposed in the deep well region 108 and surround sidewalls and bottoms of the corresponding trench insulating structures 120a. It should be particularly noted that the doped regions 122a are physically connected to the isolation structure 116 and the buried layer 114, as shown in FIG. 1.

A method for forming the trenching insulating structure 120 and the doped region 122 is very simple. First, a trench is formed in the epitaxial layer 104. A method for forming the trench is, for example, performing an etching process. Next, the doped region 122 is formed in the epitaxial layer at a sidewall and a bottom of the trench. According to an embodiment, a method for forming the doped region 122 is, for example, performing a tilted ion implantation process. A tilted angle is, for example, greater than 0 degree and less than 90 degrees. According an embodiment, a method for forming the doped region 122 is, for example, performing a diffusion process. Next, an insulating material (such as silicon oxide) is used to fill up the trench. A method for filling up the trench is, for example, using a CVD process to fill a silicon oxide layer into the trench. Next, an etching back process or a chemical mechanical polishing (CMP) process is performed to remove a portion of the silicon oxide layer until a surface of the epitaxial layer 104 is exposed.

According to the present invention, the trench is first formed and the tilted ion implantation process is then performed, so that the position of the doped region 122 (i.e. P-type doped region) deeper, and 2-dimensional charge balancing is further achieved. Moreover, the concentration in the N-type drifting region is also increased, thereby enhancing device performance.

Figure 2:
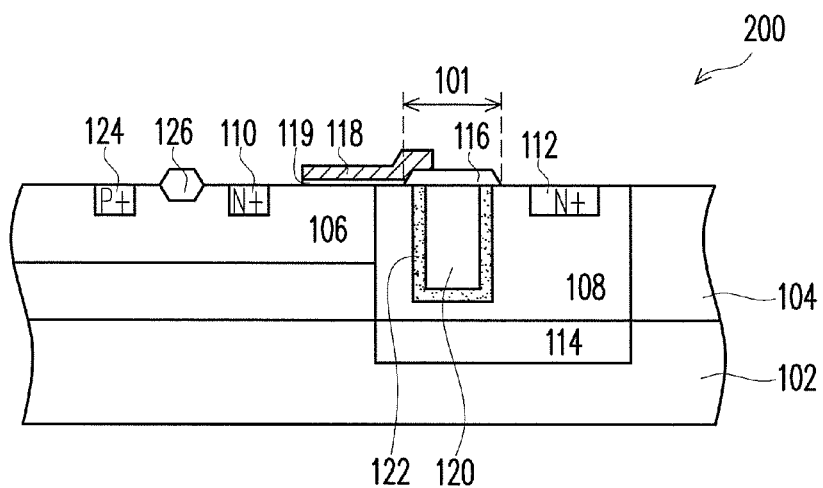
FIG. 2 is a schematic cross-sectional diagram of an LDMOS device according to yet another embodiment of the present invention.

Moreover, in addition to being physically connected to the isolation structure 116 and the buried layer 114 (as shown in FIG. 1), the trench insulation structure 120 and the doped region 122 may also be disposed in a variety of different ways. According to another embodiment, the doped region 122 is physically connected to the isolation structure 116 but is not physically connected to the buried layer 114, as shown in FIG. 2.

Figure 1B:
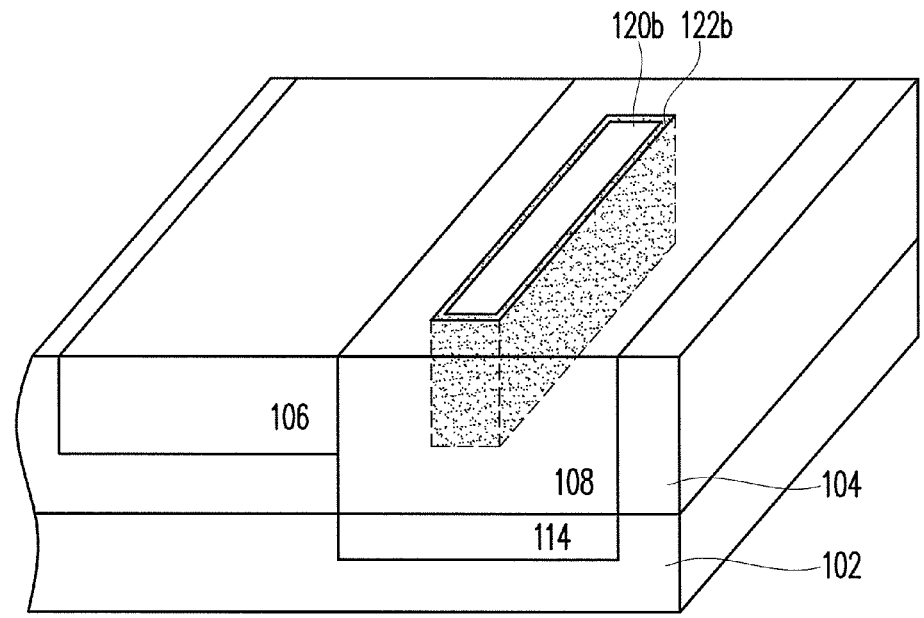
FIG. 1B is a partial schematic perspective diagram of an LDMOS device according to another embodiment of the present invention.

According to the above embodiment, a plurality of trench insulating structures and a plurality of doped regions are described as an example. However, the present invention is not limited to this arrangement. According to an embodiment, a trench insulation structure 120b may also be a strip-shaped region which is disposed in the epitaxial layer 104, and a doped region 122b surrounds a sidewall and a bottom of the trench insulating structure 120b. Similarly, the doped region 122b may be physically connected to only the isolation structure 116, as shown in FIG. 1B, physically connected to only the buried layer 114, or not physically connected to the isolation structure 116 or the buried layer 114. It should be particularly noted that the doped region 122b cannot be physically connected to both the isolation structure 116 and the buried layer 114, otherwise the current path may be blocked.

Figure 3:
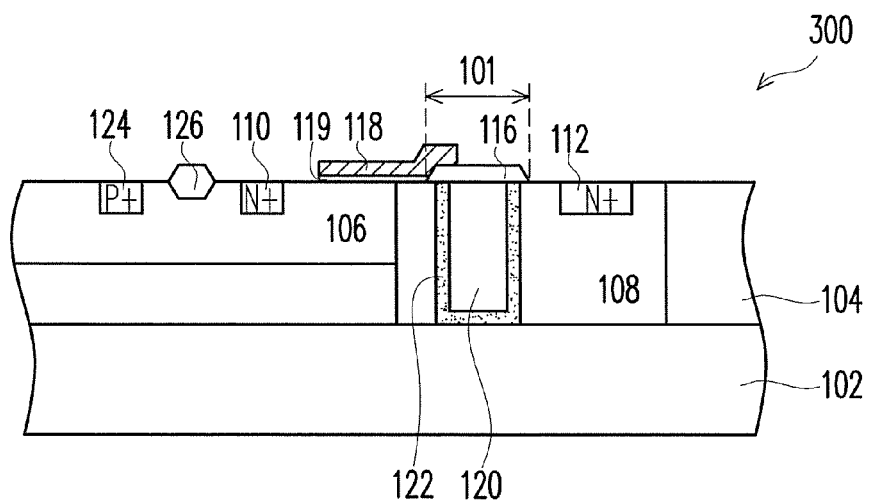
FIG. 3 is a schematic cross-sectional diagram of an LDMOS device according to still another embodiment of the present invention.
Figure 4:
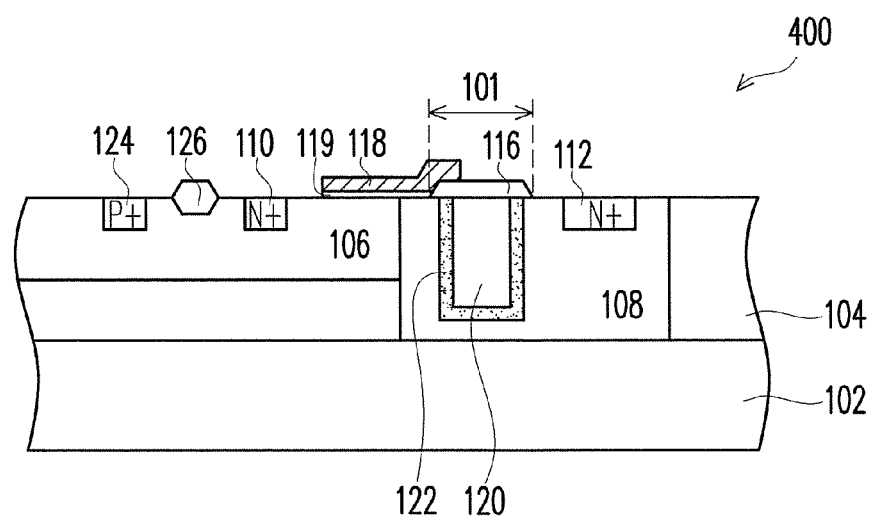
FIG. 4 is a schematic cross-sectional diagram of an LDMOS device according to another embodiment of the present invention.

It should be particularly noted that the buried layer 114 is an optional element. According to process requirements, the step of forming the buried layer 114 may be canceled. In other words, when the buried layer 114 is absent, the doped region 122 may be physically connected to the isolation structure 116 and the substrate 102, as shown in FIG. 3. According to another embodiment, the doped region 122 is physically connected to the isolation structure 116 but is not physically connected to the substrate 102, as shown in FIG. 4.

Moreover, the LDMOS device 100 according to the present invention also defines a drifting region 101 and a RESURF structure disposed in the drifting region 101, as shown in FIG. 1. Specifically, in the drifting region 101, the RESURF structure includes the substrate 102, the epitaxial layer 104, the deep well region 108, the buried layer 114, the isolation structure 116, at least one trench insulation structure 120, and at least one doped region 122. The deep well region 108 is disposed in the epitaxial layer 104. The buried layer 114 is disposed in the substrate 102 below the deep well region 108. The isolation structure 116 is disposed on the deep well region 108. The trench insulating structure 120 is disposed in the deep well region 108 below the isolation structure 116. The doped region 122 is disposed in the deep well region 108 and surrounds the sidewall and the bottom of the trench insulating structure 120. Similarly, as shown in FIGS. 2-4, each of LDMOS devices 200-400 according to the present invention can also define the drifting region 101 and the RESURF structure disposed in the drifting region 101.

Moreover, in addition to being applied in the LDMOS device, the RESURF structure is also able to be applied in other suitable devices, such as a junction field effect transistor (JFET).

In summary, in the structure according to the present invention, at least one trench insulating structure and at least one doped region are disposed in the substrate, and the doped region surrounds the sidewall and the bottom of the trench insulating structure, so as to reduce the surface field. Moreover, according to the present invention, the trench is first formed and the tilted ion implantation process is then performed, so that the concentration in the doped region is uniform, and a shape and a depth thereof are easily controlled. Problems of non-uniform concentration and insufficient accuracy in conventional art are thus resolved.

It will be apparent to those skilled in the art that various modifications and variations can be made to the present invention without departing from the scope or spirit of the present invention. In view of the foregoing, it is intended that the present invention cover modifications and variations of this present invention provided they fall within the scope of the following claims and their equivalents.

What is claimed is:

1. A lateral diffused metal oxide semiconductor (LDMOS) device, comprising:
    a substrate of a first conductivity type;
    an epitaxial layer of a second conductivity type, disposed on the substrate;
    a well region of the first conductivity type, disposed in the epitaxial layer;
    a deep well region of the second conductivity type, disposed in the epitaxial layer;
    a source region of the second conductivity type, disposed in the well region;
    a drain region of the second conductivity type, disposed in the deep well region;
    an isolation structure, disposed on the deep well region;
    a gate, disposed on the epitaxial layer between the drain region and the source region and extending to above a portion of the isolation structure;
    at least one trench insulating structure, disposed in the deep well region below the isolation structure; and
    at least one doped region of the first conductivity type, disposed in the deep well region and surrounding a sidewall and a bottom of the trench insulating structure.

2. The LDMOS device as claimed in claim 1, further comprising a buried layer of the second conductivity type disposed in the substrate below the deep well region.

3. The LDMOS device as claimed in claim 2, wherein the doped region is physically connected to the isolation structure and the buried layer.

4. The LDMOS device as claimed in claim 1, wherein the doped region is physically connected to the isolation structure and the substrate.

5. The LDMOS device as claimed in claim 1, wherein a material of the trench insulating structure comprises silicon oxide.

6. The LDMOS device as claimed in claim 1, wherein the isolation structure comprises a field oxide structure or a shallow trench isolation structure.

7. The LDMOS device as claimed in claim 1, further comprising a body region of the first conductivity type disposed in the well region.

8. The LDMOS device as claimed in claim 1, further comprising a gate oxide layer disposed between the gate and the epitaxial layer.

9. The LDMOS device as claimed in claim 1, wherein the first conductivity type is P-type, and the second conductivity type is N-type; or the first conductivity type is N-type, and the second conductivity type is P-type.

10. A reduced surface field (RESURF) structure, comprising:
    a substrate of a first conductivity type;
    an epitaxial layer of a second conductivity type, disposed on the substrate;
    a deep well region of the second conductivity type, disposed in the epitaxial layer;
    an isolation structure, disposed on the deep well region;
    at least one trench insulating structure, disposed in the deep well region below the isolation structure; and
    at least one doped region of the first conductivity type, disposed in the deep well region and surrounding a sidewall and a bottom of the trench insulating structure.

11. The RESURF structure as claimed in claim 10, further comprising a buried layer of the second conductivity type disposed in the substrate below the deep well region.

12. The RESURF structure as claimed in claim 11, wherein the doped region is physically connected to the isolation structure and the buried layer.

13. The RESURF structure as claimed in claim 10, wherein the doped region is physically connected to the isolation structure and the substrate.

14. The RESURF structure as claimed in claim 10, wherein a material of the trench insulating structure comprises silicon oxide.

15. The RESURF structure as claimed in claim 10, wherein the isolation structure comprises a field oxide structure or a shallow trench isolation structure.

16. The RESURF structure as claimed in claim 10, wherein the first conductivity type is P-type, and the second conductivity type is N-type; or the first conductivity type is N-type, and the second conductivity type is P-type.

* * * * *